(12) United States Patent
Hauser et al.

(10) Patent No.: US 7,208,827 B2
(45) Date of Patent: Apr. 24, 2007

(54) ENCASING ARRANGEMENT FOR A SEMICONDUCTOR COMPONENT

(75) Inventors: Christian Hauser, Regensburg (DE); Simon Muff, Höhenkirchen (DE); Jens Pohl, Bernhardswald (DE); Friedrich Wanninger, München (DE)

(73) Assignee: Infineon Technologies AG, München (DE)

( * ) Notice: Subject to any disclaimer, the term of this patent is extended or adjusted under 35 U.S.C. 154(b) by 249 days.

(21) Appl. No.: 10/149,892

(22) PCT Filed: Dec. 13, 2000

(86) PCT No.: PCT/DE00/04437

§ 371 (c)(1),
(2), (4) Date: Oct. 1, 2004

(87) PCT Pub. No.: WO01/45166

PCT Pub. Date: Jun. 21, 2001

(65) Prior Publication Data

US 2005/0040517 A1    Feb. 24, 2005

(30) Foreign Application Priority Data

Dec. 14, 1999  (DE) ............................... 199 60 246

(51) Int. Cl.
*H01L 23/22*  (2006.01)
*H01L 23/48*  (2006.01)
*H01L 23/52*  (2006.01)
*H01L 29/40*  (2006.01)

(52) U.S. Cl. ............... 257/687; 257/729; 257/730; 257/773; 257/776; 257/779; 257/782; 257/783

(58) Field of Classification Search ............... None
See application file for complete search history.

(56) References Cited

U.S. PATENT DOCUMENTS

| 5,708,567 | A | 1/1998 | Shim et al. |
| 5,814,894 | A | 9/1998 | Igarashi et al. |
| 5,843,810 | A | 12/1998 | Sato et al. |
| 5,905,633 | A | 5/1999 | Shim et al. |
| 6,433,412 | B2 * | 8/2002 | Ando et al. .................. 257/678 |
| 2001/0040299 | A1 * | 11/2001 | Moden ........................ 257/778 |

FOREIGN PATENT DOCUMENTS

JP    10 065 072 A    3/1998

OTHER PUBLICATIONS

Andros, F. et al.: "TBGA Package Technology", IEEE, vol. 17, No. 4, Nov. 1994, pp. 564-568.

(Continued)

*Primary Examiner*—Jasmine Clark
(74) *Attorney, Agent, or Firm*—Laurence A. Greenberg; Werner H. Stemer; Ralph E. Locher

(57) ABSTRACT

A semiconductor component package configuration includes a semiconductor chip mounted to a printed circuit board, and a substrate arranged between the semiconductor chip and the printed circuit board. The substrate is for routing the wiring terminals of the semiconductor chip to the printed circuit board. The substrate is connected to the printed circuit board by solder joints. A filler between the semiconductor chip and the substrate mechanically isolates the semiconductor chip and the solder joints. A metal layer, which is connected to solder joints, is applied to the substrate. At least one molded element of heat-dissipating material is applied to the metal layer and is connected in a heat-conducting manner to the metal layer. This provides the package configuration with an improved capability of conducting the lost power that is dissipated from the installed semiconductor chip, and the desired mechanical properties of the package arrangement are retained.

11 Claims, 4 Drawing Sheets

OTHER PUBLICATIONS

Author not listed: "Thermische Modellierung von Ball Grid Arrays", [Thermal Simulation of Ball Grid Arrays], Elektronik, Aug. 1997, pp. 142-144.

Beine, H.: "Mikro-BGA: Durchbruch für die Chip-Scale-Packages", [Micro-BGA: Breakthrough for the Chip-Scale-Packages], productronic, Nov., 1997, pp. 124-125.

Moscicki, J.-P.: "CSP-BGA Gehäuse: Die Kleinste der Kleinen", [CSP-BGA Casing: The Smallest of the Small], Elektronik, Dec., 1998, pp. 58-61.

Eyman, L. et al.: "A Thermally Enhanced 2-Layer PBGA Substrate Design", Motorola Inc., Jan. 1999.

* cited by examiner

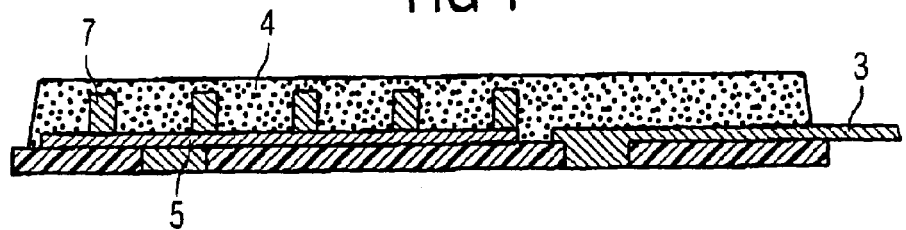
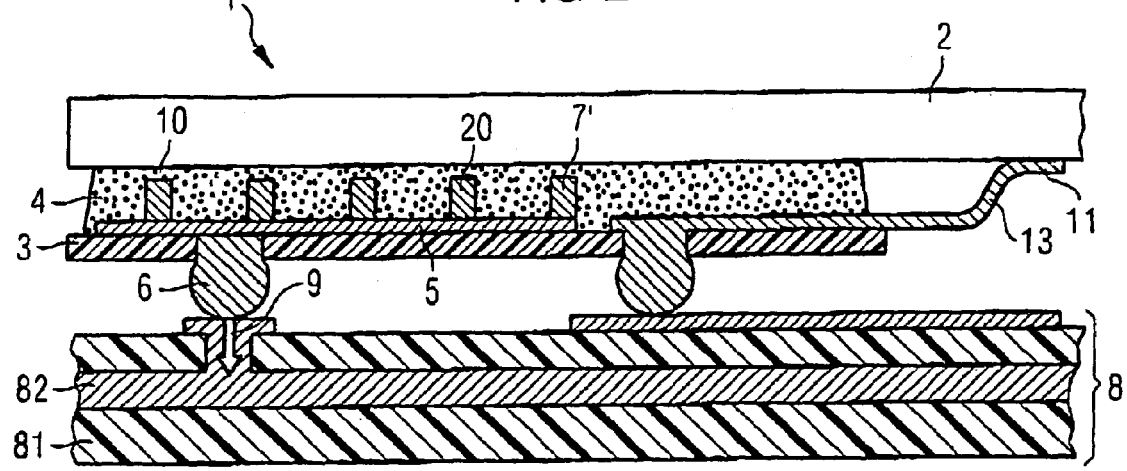

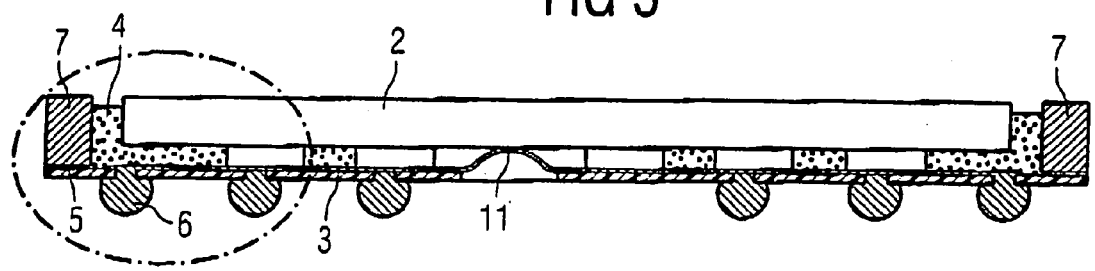
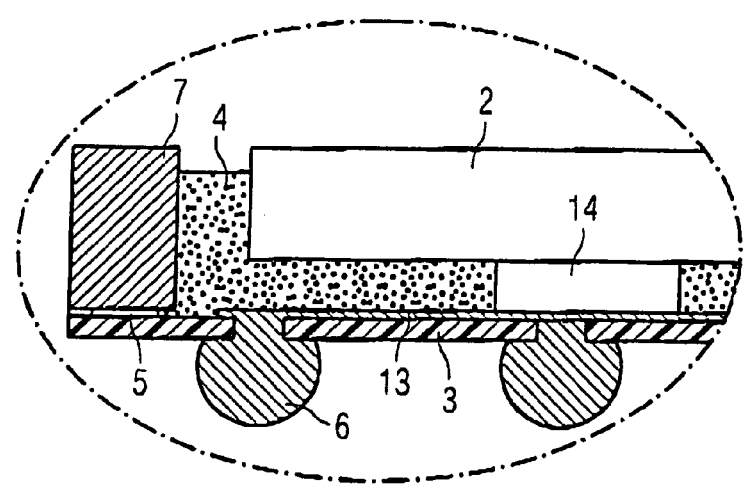

ENCASING ARRANGEMENT FOR A SEMICONDUCTOR COMPONENT

BACKGROUND OF THE INVENTION

Field of the Invention

The present invention relates to a semiconductor component package configuration which includes a printed circuit board, a semiconductor chip and a substrate lying in between for routing the wiring terminals of the semiconductor chip to the printed circuit board. The substrate is bonded to the printed circuit board by solder joints and the solder joints are mechanically isolated from the semiconductor chip by a filler.

Integrated semiconductor circuits are used in various applications. The semiconductor chip is generally housed in a package and mounted on a printed circuit board. For example, a semiconductor component can be arranged in a package arrangement according to what is known as an FBGA package arrangement (FBGA: Fine Pitch Ball Grid Array), which is based on what is known as the beam-lead bonding technique. This type of package arrangement is characterized by a special package design with respect to the arrangement of the solder balls.

A package arrangement such as the FBGA package arrangement, also referred to as an FBGA package, usually includes a semiconductor chip with terminals for electrically connecting to terminals of the printed circuit board and a substrate that acts as a kind of wiring plane. The substrate is in this case arranged between the semiconductor chip and the printed circuit board. The substrate, as a wiring plane, has electrically conducting connections to the terminals of the semiconductor chip. These interconnects of the substrate are connected in turn to the printed circuit board by solder joints. Since the semiconductor chip and the solder joints or solder balls generally have different coefficients of expansion under changing temperatures, it is necessary for the semiconductor chip and the solder balls to be mechanically isolated from one another. For this purpose, a filler, also referred to as an encapsulate or cushioning material, is provided, for example, between the semiconductor chip and the substrate.

During the operation of an integrated semiconductor circuit there is generally a certain loss of power, which, to avoid potential damage, for example, from overheating or accelerated aging, must be dissipated. To eliminate the possibility of overheating a semiconductor component, it is provided with heat sinks or heat spreaders. Heat sinks are usually cooled externally and consequently assume a constant temperature. Heat spreaders are used, for example, to create a larger surface area, which better dissipates the heat to the outside by convection. They are formed, for example, by metal plates that are fastened on the package or introduced directly into the package.

U.S. Pat. No. 5,814,894 shows a semiconductor component in which blind leads, which are connected to the chip and lead to contact bumps, are provided for heat dissipation. However, only little heat can be dissipated in this way, and a heat sink is additionally provided. Problems also arise because of the different coefficients of expansion, since the arrangement is formed without any filling material.

The main heat path in the case of the described type of package arrangements for dissipating the lost power is the path from the semiconductor chip via the filling material and the solder balls to the printed circuit board. The relatively poor thermal conductivity of the filling material or the cushioning material in this case limits the heat resistance of the package. With limited thermal conductivity of the package, the lost power that can be dissipated is limited, as a result of which the performance of an integrated semiconductor circuit may likewise be limited.

A semiconductor component with such a filling material is presented, for example, in U.S. Pat. No. 5,843,810, where the space between the semiconductor chip and the wiring elements is filled with a buffer material that is in contact, via a seal, with an outer ring serving as reinforcement. The reference does not concern itself with the problem of how the lost heat of the chip will be dissipated.

An improvement in the thermal conductivity of the main heat path is possible by using thermally conductive filling material or cushioning material. However, there are limits to this method, since with the thermally conductive filler, the elastic properties and the desired processing properties of the filling material are generally lost. This has the consequence of reduced mechanical isolation of the semiconductor chip and the solder balls.

SUMMARY OF THE INVENTION

The object of the present invention is to specify an arrangement of a semiconductor component in the described package arrangement which has improved conductivity of the lost power that will be dissipated from an installed semiconductor chip and with which the mechanical properties of the package arrangement are retained.

The object of the invention is obtained by providing a semiconductor component package configuration including:
- a semiconductor chip with wiring terminals; a printed circuit board, on which the semiconductor component is mounted;
- a substrate, which is arranged between the semiconductor chip and the printed circuit board, for routing the wiring terminals of the semiconductor chip to the printed circuit board;
- in which the substrate is connected to the printed circuit board by solder joints;
- in which a filler is arranged between the semiconductor chip and the substrate for mechanically isolating the semiconductor chip and the solder joints;
- in which there is applied to the substrate, a metal layer, which is connected to at least one of the solder joints; and
- in which at least one molded element of heat-dissipating material is applied to the metal layer;
- in which the molded element is connected in a heat-conducting manner to the metal layer;
- and in which the molded element of heat-dissipating material is not in direct contact with the semiconductor chip.

The arrangement has a semiconductor chip with wiring terminals, a printed circuit board, onto which the semiconductor component is mounted, and a substrate that is arranged between the semiconductor chip and the printed circuit board. The substrate serves for routing the wiring terminals of the semiconductor chip to the printed circuit board and is connected to the printed circuit board by solder joints. Arranged between the semiconductor chip and the substrate is a filler, which serves for mechanically isolating the semiconductor chip and the solder joints. Also applied on the substrate, in addition to the interconnects to the terminals of the semiconductor chip, is a metal layer that is connected to at least one of the solder joints. Furthermore, at least one molded element of heat-dissipating material is applied to the metal layer and is connected to it in a heat-conducting manner. The provision of the heat-conducting molded element improves the capability of conducting the lost power of the package arrangement to be dissipated. The previously used filling material with the desired properties may be used as the filler.

The molded element serves, for example, for reducing at certain points, the distance between the substrate, also referred to as the interposer, and the semiconductor chip, and consequently for bridging the relatively poor thermal conductivity of the filling material. Similarly, a further possible heat path can be created by an appropriate locational arrangement of the molded element, contributing to the removal of the produced lost power. The transported heat is transferred to the metal layer of the substrate and conducted from it via the solder joints into the metal areas of the printed circuit board. Accordingly, the heat-dissipating molded element performs the function of a heat sink with respect to the semiconductor chip. So that the mechanical properties of the package arrangement are not influenced by the molded element, the molded element is not in direct contact with the semiconductor chip. The described structure of the package arrangement is used, in particular, in the case of FBGA package arrangements.

To shorten the distance between the substrate and the semiconductor chip, the molded element is arranged in a suitable way such that it protrudes into the filler. The molded element is in this case preferably designed as a cylinder.

In the interests of high thermal conductivity, it is favorable for a metal layer to be applied to the substrate in the form of large interconnected metal areas. Similarly, the thermal conductivity and its distribution are enhanced by applying a plurality of relatively small cylinders to the metal layer. Since metal has good thermal conductivity, the molded elements are preferably formed from metal.

The described structure of the metal layer and the molded elements can be produced, for example, by a mask etching process or by electrodepositing the molded elements. The molded elements or cylinders are embedded into the filling material before mounting the semiconductor chip. In the mounted state, the molded elements or cylinders protrude as far as the chip surface, so that an improved heat path is produced from the semiconductor chip through the molded elements into the metal layer. From the metal layer, the heat is dissipated through solder joints or solder balls that are not electrically connected and that are referred to as no-connects, and by thermal vias in the printed circuit board into metal tracks of the printed circuit board. These thermal vias are, for example, metal-filled holes in the printed circuit board (board), which can be produced by known processes, for example by electrodeposition. If the molded elements are arranged on the substrate in an appropriate number and with appropriate area coverage, a significant improvement in the heat resistance is achieved, while at the same time retaining the elastic and isolating properties of the filling material.

A further refinement of the invention provides a molded element applied to the metal layer and arranged on a side of the substrate facing the semiconductor chip and to the side of the semiconductor chip. This opens a further heat path to the side of the semiconductor chip, which altogether increases the thermal conductivity of the FBGA package arrangement.

The mechanical stability of the described package arrangement can be increased by what is known as a support ring, i.e. a frame which surrounds the semiconductor chip. An application of this type is expedient, for example, for package arrangements in which the array of solder joints or the interposer extends out over the area of the chip ("fan out"). The arrangement of this frame as specified by the invention consequently provides it with the function of a heat sink in addition to the mechanically stabilizing function.

If, in addition, the frame is electrically conductive and connected to ground potential, additional electrical improvements are obtained. The frame, which has, with respect to the housing, the form of a ring antenna, produces a general shielding of all of the electrical paths of the metal layer. In addition, the inductance of the ground terminals connected to the frame is decreased, which reduces, in particular, the noise caused by rapid changes in current ("delta I noise"). At the same time, the capacitance of the ground terminals is increased, which leads to better radio frequency decoupling of the voltage supply system. The inductance of further electrical connections, for example, of data lines or address lines, is likewise lowered by the additional ground reference that the frame represents.

In a development of the invention, the frame is applied directly to the metal layer and is fastened by a heat-conducting adhesive. If the metal layer is located on a side of the substrate lying opposite from the frame, the frame is applied to the metal layer and connected to it in a heat-conducting manner through a clearance in the substrate by using a conducting adhesive layer. This connection may also be performed by bonding.

To improve the heat dissipation via the frame, in a development of the invention, an additional, electrically non-conducting, thermally conductive connection is arranged between the semiconductor chip and the molded element. This thermally conductive connection may be established, for example, by a heat-conducting paste.

Moreover, further improved heat dissipation from the semiconductor chip can be achieved by connecting wiring terminals of the semiconductor chip, which have no electrical function, to the metal layer of the interposer.

The invention is explained in more detail below on the basis of the figures represented in the drawing.

BRIEF DESCRIPTION OF THE DRAWINGS

FIGS. 1 and 2 are cross sectional views of an embodiment of the invention;

FIG. 5 is a sectional view of an embodiment of a package arrangement;

FIGS. 6 and 7 show details from FIG. 5; and

DESCRIPTION OF THE PREFERRED EMBODIMENTS

Figure 3:
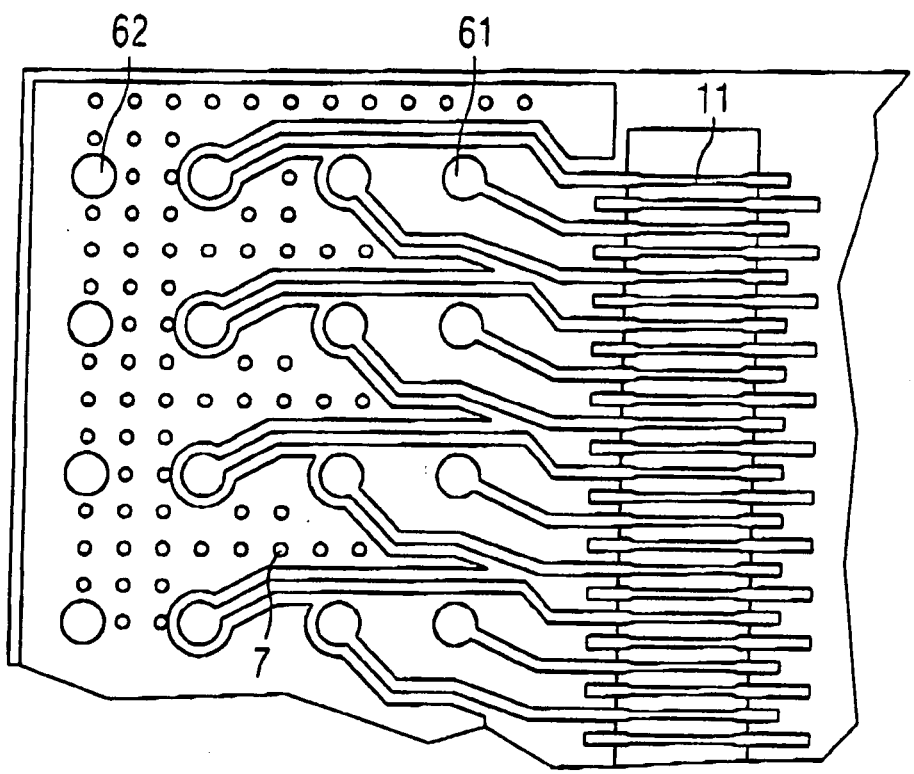
FIG. 3 is a plan view of an embodiment of the invention.

FIG. 1 shows a cross section of an embodiment of the invention constructed as an FBGA package arrangement, before mounting the semiconductor chip. It shows the substrate 3 (interposer), to which a metal layer 5 is applied. The metal layer 5 has a molded element 7 of heat-dissipating material, which is designed in FIG. 1 as a cylinder. Shown alongside the cylinder are further identical cylinders that are, for example, formed from metal, and that are connected in a heat-conducting manner to the metal layer. Applied above the metal layer 5 is the filler 4 (cushioning material).

FIG. 2 shows a cross section of the structure shown in FIG. 1 after mounting the chip and solder balls and after being soldered onto the printed circuit board 8. The substrate 3 is arranged between the semiconductor chip 2 and the printed circuit board 8 and serves for routing wiring terminals (known as bonding pads) of the semiconductor chip 2 to the printed circuit board 8 by using the interconnect 13. The substrate 3 is connected to the printed circuit board 8 by solder joints 6. The filler 4 is arranged between the semiconductor chip 2 and the substrate 3 and serves for mechanically isolating the semiconductor chip 2 and the solder joints 6. The printed circuit board 8 is made up of the PCB 81 itself and a copper layer 82 of a larger surface area (power plane of the PCB). After the semiconductor chip 2 has been laminated on, a comparatively small distance 10 is obtained between the semiconductor chip 2 and the molded elements 7. This distance is determined essentially by the technical aspects of the process and is, for example, 10–20 μm. The filler 4 usually consists of a polyimide-based material. The substrate 3 consists, for example, of a supporting material FR-4. The lost power generated in the semiconductor chip 2 is dissipated via the metal layer 5 and the solder joints 6 by way of the represented thermal via 9 into the printed circuit board 8, represented by the heat-conducting path 20. Since, over the molded element 7, the distance between the metal layer 5 and the semiconductor chip 2 is reduced, the thermal conductivity along the heat-conducting path 20, and consequently of the semiconductor component 1 as a whole, is increased.

Figure 4:
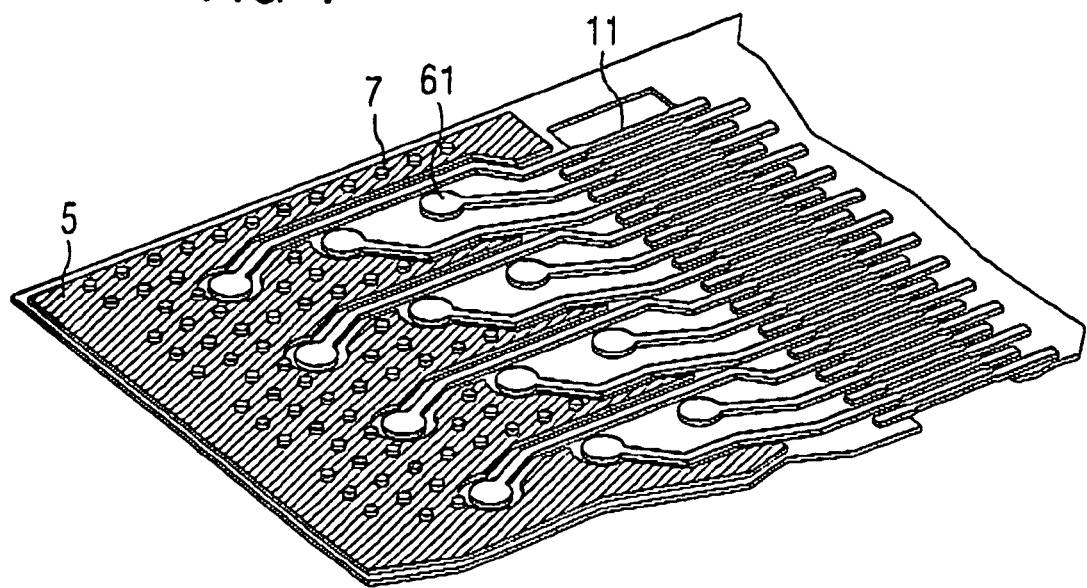
FIG. 4 is a three-dimensional representation of an embodiment of the invention.

FIGS. 3 and 4 respectively show a plan view and a three-dimensional representation of the embodiment of the invention shown in FIGS. 1 and 2. The wiring terminals 11 of the semiconductor chip 2 are connected to the solder joints or solder balls 6 by the terminals 61 for the solder joints. The terminals 62 designate terminals for "thermal", i.e. electrically inactive, solder joints 6. The metal layer 5 is arranged in the form of large interconnected metal areas. The molded elements 7 are applied to the metal layer 5 in a correspondingly dense coverage of the surface.

FIG. 5 shows a sectional representation of further package arrangement. According to a further embodiment of the invention, the molded element 7 is arranged on the side of the substrate 5 facing the semiconductor chip 2 and to the side of the semiconductor chip 2. The molded element 7 is designed in the form of a frame which surrounds the semiconductor chip 2. The frame also contributes to the mechanical stabilization of the package.

Figure 7:
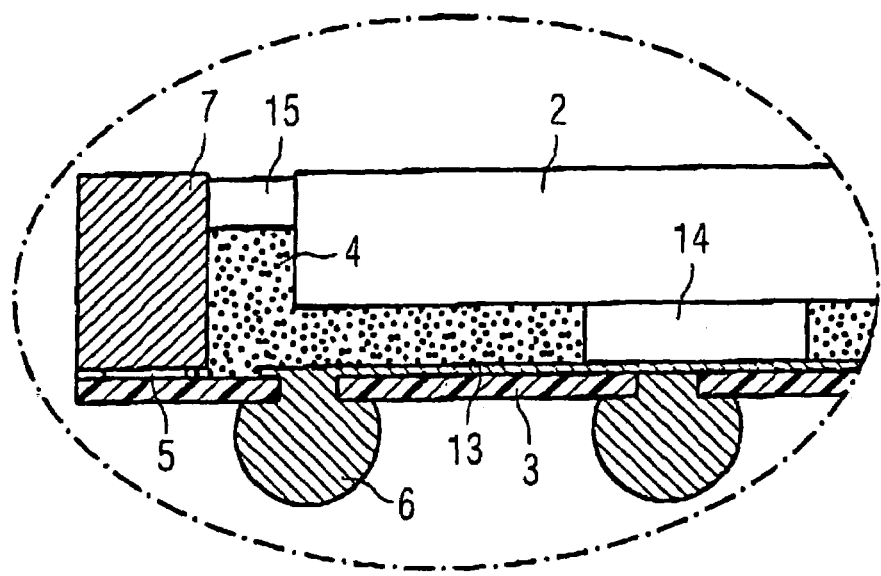

The sectional representation shown in FIG. 5 is respectively represented as a detail in FIGS. 6 and 7. The molded element 7 is applied to the metal layer 5 for example by a heat-conducting adhesive. In this exemplary embodiment, a plurality of nubbins 14 are arranged between the semiconductor chip 2 and the substrate 3. The nubbins 14 consist, for example, of an organic material containing silicone rubber. The molded element 7 or the frame is expediently formed from metal. To improve the thermal conductivity between the semiconductor chip 2 and the molded element 7, an additional thermally conductive connection 15 is arranged between the semiconductor chip 2 and the molded element 7, for example, in the form of a heat-conducting paste, as represented in FIG. 7. The adhesive layer, not represented in FIG. 6 or FIG. 7, may also be replaced by a bonding. The metal layer 5 is formed here, as in the exemplary embodiments previously described, for example, from copper.

Figure 8:
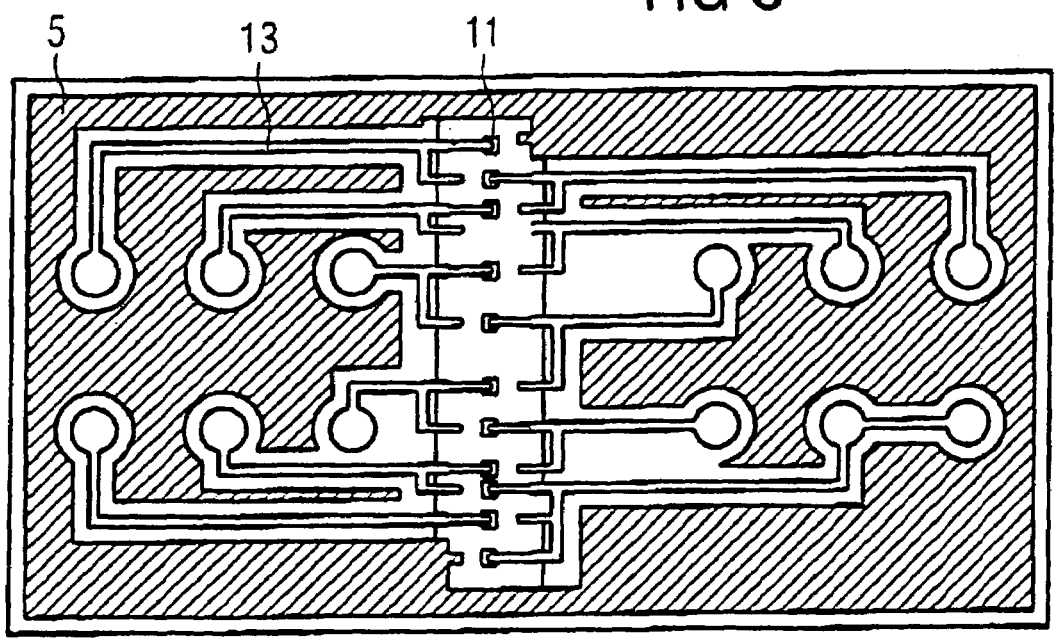
FIG. 8 is a plan view of the embodiment of the invention shown in FIG. 5.

FIG. 8 shows a plan view of the embodiment of the invention shown in FIG. 5 with interconnects 13 and the wiring terminals 11. The metal layer 5 is arranged in the form of interconnected metal areas. For the connection of the molded element or the frame to ground potential, the metal layer 5 is correspondingly connected by solder balls (not represented in the FIG.) to ground terminals (known as ground pins).

We claim:

1. A semiconductor component package configuration, comprising:
    a semiconductor chip having wiring terminals;
    a printed circuit board having said semiconductor component mounted thereon;
    a substrate configured between said semiconductor chip and said printed circuit board, said substrate for routing said wiring terminals of said semiconductor chip to said printed circuit board;
    solder joints connecting said substrate to said printed circuit board;
    a filler configured between said semiconductor chip and said substrate, said filler for mechanically isolating said semiconductor chip and said soldered joints;
    a metal layer applied to said substrate, said metal layer being connected to at least one of said solder joints; and
    at least one molded element of heat-dissipating material applied to said metal layer, said molded element connected in a heat-conducting manner to said metal layer, said molded element not directly contacting said semiconductor chip.

2. The configuration according to claim 1, wherein:
    said molded element is configured between said substrate and said semiconductor chip and protrudes into said filler; and
    said molded element is at a distance of about 10–20 μm from said semiconductor chip.

3. The configuration according to claim 2, wherein: said molded element is formed as a cylinder.

4. The configuration according to claim 1, wherein: said molded element is formed from metal.

5. The configuration according to claim 4, wherein: said molded element has been electrodeposited onto said metal layer.

6. The configuration according to claim 4, wherein: said molded element has been applied to said metal layer by a mask etching process.

7. The configuration according to claim 1, wherein:
    said substrate has a side facing said semiconductor chip;
    said semiconductor chip has a side; and
    said molded element is configured on said side of said substrate facing said semiconductor chip and to said side of said semiconductor chip.

8. The configuration according to claim 7, wherein:
    said molded element is formed as an electrically conductive, metallic frame surrounding said semiconductor chip; and
    said molded element is connected to ground potential.

9. The configuration according to claim 7, comprising: a heat-conducting adhesive connecting said molded element to said metal layer.

10. The configuration according to claim 7, wherein: said molded element is bonded to said metal layer.

11. The configuration according to claim 7, comprising: an additional, electrically non-conducting, thermally conductive connection configured between said semiconductor chip and said molded element.

* * * * *